US012626734B2

(12) United States Patent
Wu et al.

(10) Patent No.: US 12,626,734 B2
(45) Date of Patent: May 12, 2026

(54) MEMORY, STORAGE SYSTEMS, AND OPERATION METHODS OF MEMORY

(71) Applicant: Yangtze Memory Technologies Co., Ltd., Wuhan (CN)

(72) Inventors: Zhuangzhuang Wu, Wuhan (CN); Ruxin Wei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 170 days.

(21) Appl. No.: 18/422,945

(22) Filed: Jan. 25, 2024

(65) Prior Publication Data

US 2025/0157497 A1     May 15, 2025

(30) Foreign Application Priority Data

Nov. 14, 2023    (CN) .......................... 202311528304.0

(51) Int. Cl.
*G11C 5/14*        (2006.01)
*G11C 7/22*        (2006.01)
*H02M 1/14*        (2006.01)
*H02M 3/07*        (2006.01)

(52) U.S. Cl.
CPC .............. *G11C 5/145* (2013.01); *G11C 7/222* (2013.01); *H02M 1/14* (2013.01); *H02M 3/07* (2013.01)

(58) Field of Classification Search
CPC ..... G11C 5/145; G11C 7/222; G11C 11/4063; H02M 1/14; H02M 3/07; H02M 3/071
USPC ......................................... 365/226
See application file for complete search history.

(56) References Cited

U.S. PATENT DOCUMENTS

| | | | | |
|---|---|---|---|---|
| 12,028,072 | B2 * | 7/2024 | Balteanu .............. | H03K 17/693 |
| 2008/0043559 | A1 * | 2/2008 | Norman ................... | G11C 5/02 |
| | | | | 365/226 |
| 2024/0233835 | A1 * | 7/2024 | Suzuki ............... | G11C 16/0483 |
| 2024/0421808 | A1 * | 12/2024 | Lee .......................... | H03K 5/24 |

* cited by examiner

*Primary Examiner* — Fernando Hidalgo
(74) *Attorney, Agent, or Firm* — Hanley, Flight & Zimmerman, LLC

(57)        ABSTRACT

Examples of the present disclosure provide a memory, a storage system, and an operation method of a memory. The memory includes: a plurality of memory planes and a peripheral circuit coupled to the memory planes. The peripheral circuit includes: a plurality of charge pumps, a charge pump having a clock signal end, an input end, and an output end, wherein the output end of each of the charge pumps is coupled to one of the plurality of memory planes; the charge pump is configured to boost an input voltage of the input end according to a clock signal received by the clock signal end and then output the same to the output end; wherein clock signals received by clock signal ends of the plurality of charge pumps are different.

20 Claims, 4 Drawing Sheets

Ampi read:            Normal read:

| vneg_pl0 | | load_pl0 |
| vneg_pl1 | | load_pl1 |
| vneg_pl2 | | load_pl2 |
| vneg_pl3 | | load_pl3 |
| vneg_pl4 | | load_pl4 |
| vneg_pl5 | | load_pl5 |

AC stage and DC stage

AC stage

MEMORY, STORAGE SYSTEMS, AND OPERATION METHODS OF MEMORY

CROSS-REFERENCE TO RELATED APPLICATIONS

The present application claims the benefit of priority to China Application No. 202311528304.0, filed on Nov. 14, 2023, the content of which is incorporated herein by reference in its entirety.

TECHNICAL FIELD

The present application relates to the technical field of semiconductors, and particularly to memory, storage systems, and operation methods of memory.

BACKGROUND

A three-dimensional memory typically comprises a memory array and a peripheral circuit that are stacked, wherein the peripheral circuit may apply a program voltage or a read voltage to the memory array, so as to read or write storage information.

The peripheral circuit typically comprises a charge pump that may be configured to boost or buck an input supply voltage or even generate a negative voltage, by controlling charge or discharge of an internal capacitor.

DETAILED DESCRIPTION

Figure 1:
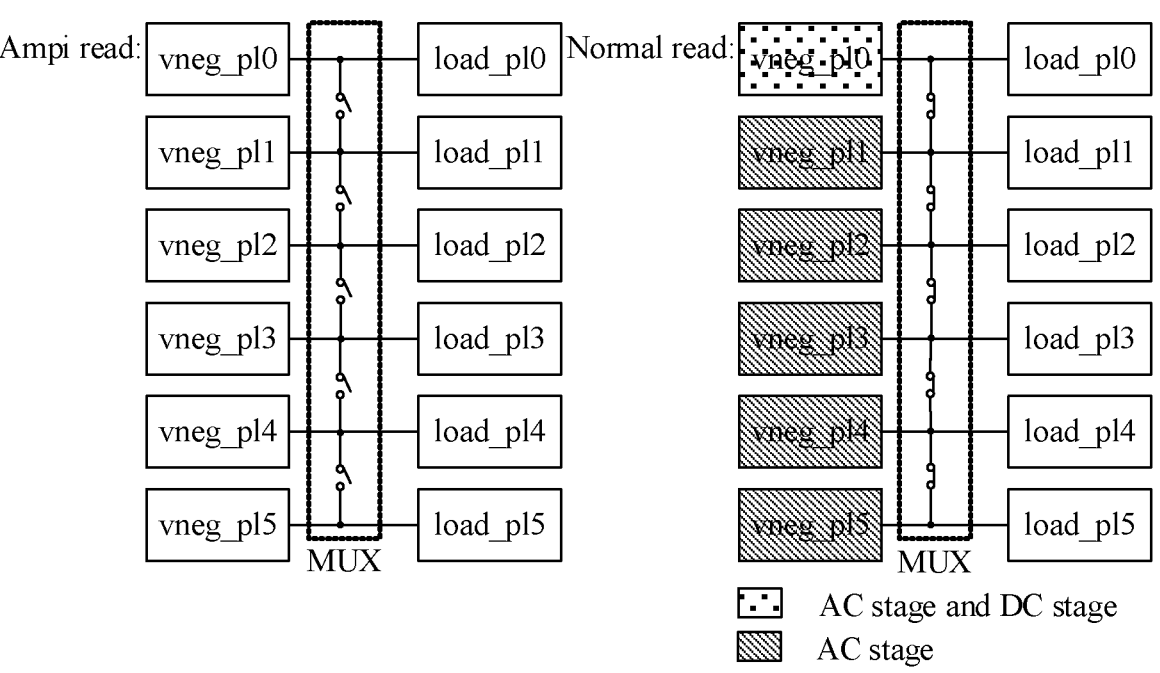
FIG. 1 is a diagram of connection states of charge pumps and memory planes in an async multi-plane independent read operation and in a normal read operation in an example.

The technical solutions in implementations of the present disclosure will be described below clearly and completely in conjunction with the implementations and the drawings of the present disclosure. Apparently, the implementations described are only part, but not all, of the implementations of the present disclosure. All other implementations obtained by those of ordinary skill in the art based on the implementations in the present disclosure without creative work shall fall in the scope of protection of the present disclosure.

In the description below, many example details are presented to provide a more thorough understanding of the present disclosure. However, it is apparent to those skilled in the art that the present disclosure may be practiced without one or more of these details. In other examples, in order to avoid confusing with the present disclosure, some technical features well-known in the art are not described; that is, not all features of actual examples are described herein, and well-known functions and structures are not described in detail.

In the drawings, sizes and relative sizes of layers, areas and elements may be exaggerated for clarity. Like reference numerals denote like elements throughout.

It should be understood that when an element or a layer is referred to as being "on", "adjacent to", "connected to", or "coupled to" other elements or layers, it may be directly on, adjacent to, connected to, or coupled to the other elements or layers, or one or more intervening elements or layers may be present. In contrast, when an element is referred to as being "directly on", "immediately adjacent to", "directly connected to", or "directly coupled to" other elements or layers, no intervening elements or layers are present. It should be understood that, although the terms first, second, third, etc., may be used to describe various elements, components, areas, layers and/or portions, these elements, components, areas, layers and/or portions should not be limited by these terms. These terms are only used to distinguish one element, component, area, layer or portion from another element, component, area, layer or portion. Thus, a first element, component, area, layer or portion discussed below may be represented as a second element, component, area, layer or portion, without departing from the teachings of the present disclosure. When the second element, component, area, layer or portion is discussed, it does not mean that the first element, component, area, layer or portion is necessarily present in the present disclosure.

The spatially relative terms, such as "beneath", "below", "lower", "under", "above", "upper", and the like, may be used herein for ease of description to describe one element or feature's relationship to other elements or features as illustrated in the figures. It should be understood that the spatially relative terms are intended to further encompass different orientations of a device in use or operation in addition to the orientation depicted in the figures. For example, if a device in the drawings is turned over, then an element or a feature described as "below other elements", or "under other elements", or "beneath other elements" will be orientated to be "above" the other elements or features. Thus, the exemplary terms, "below" and "beneath", may include both orientations of above and below. The device may be orientated otherwise (rotated by 90 degrees or other orientations), and the spatially descriptive terms used herein are interpreted accordingly.

The terms used herein are only intended to describe the examples, and are not used as limitations of the present disclosure. As used herein, unless otherwise indicated expressly in the context, "a", "an" and "the" in a singular form are also intended to include a plural form. It is also to be understood that the terms "consist of" and/or "comprise", when used in this specification, determine the presence of a feature, integer, step, operation, element and/or component, but do not preclude the presence or addition of one or more of other features, integers, steps, operations, elements, components, and/or groups. As used herein, the term "and/or" comprises any and all combinations of the listed relevant items.

In order to understand the present disclosure thoroughly, detailed operations and detailed structures will be proposed in the following description to set forth the technical solution of the present disclosure. The detailed descriptions of the preferable examples of the present disclosure are as follows. However, the present disclosure may also have other implementations in addition to these detailed descriptions.

A negative voltage charge pump, acting as an integral part of a three-dimensional memory circuit, can boost an input low supply voltage and output a higher read voltage. However, as the number of stack layers of a three-dimensional memory increases, a higher read voltage is required to be applied during a read operation.

In an example, for a three-dimensional memory with a plurality of memory planes, during an async multi-plane independent read (AMPI read) operation in order to avoid interference to the read voltage between different memory planes due to the operation, the use of negative voltage charge pump basic units of a number the same as that of the memory planes is typically required in the memory, so that each negative voltage charge pump basic unit provides a negative supply for a read voltage of a corresponding memory plane during the async multi-plane independent read operation. In a normal read operation, all the charge pump basic units typically are enabled in a ramping stage (AC stage), so as to increase a ramp rate of a negative voltage. When the negative voltage reaches a certain value, e.g., reach 98% of a target value, it enters a stable stage (DC stage). At this time, in order to reduce power consumption, only one charge pump is enabled and an underclocking operation is performed to provide negative supplies for read voltages of all the memory planes.

Reference is made to FIG. 1, FIG. 1 being a diagram of connection states of the charge pumps and the memory planes in the async multi-plane independent read operation and in the normal read operation in an example.

As shown in FIG. 1, a peripheral circuit comprises six negative voltage charge pump basic units, which are vneg_pl0, vneg_pl1, vneg_pl2, vneg_pl3, vneg_pl4, and vneg_pl5, respectively. The six negative voltage charge pump basic units correspond to six memory planes load_pl0, load_pl1, load_pl2, load_pl3, load_pl4, and load_pl5 respectively. During the async multi-plane independent read operation, each negative voltage charge pump basic unit provides a negative supply for a read voltage of a corresponding memory plane respectively. For example, vneg_pl0 provides a negative supply for the read voltage of load_pl0, and vneg_pl1 provides a negative supply for the read voltage of load_pl1. During the AC stage, the six negative voltage charge pumps are enabled to provide a negative supply for the read voltage of each of the six memory planes respectively. During the DC stage, one negative voltage charge pump, e.g., vneg_pl0, is enabled to provide a negative supply for the read voltage of each of the six memory planes respectively. At this time, the load current of the negative voltage charge pump is maximum.

Figure 2:
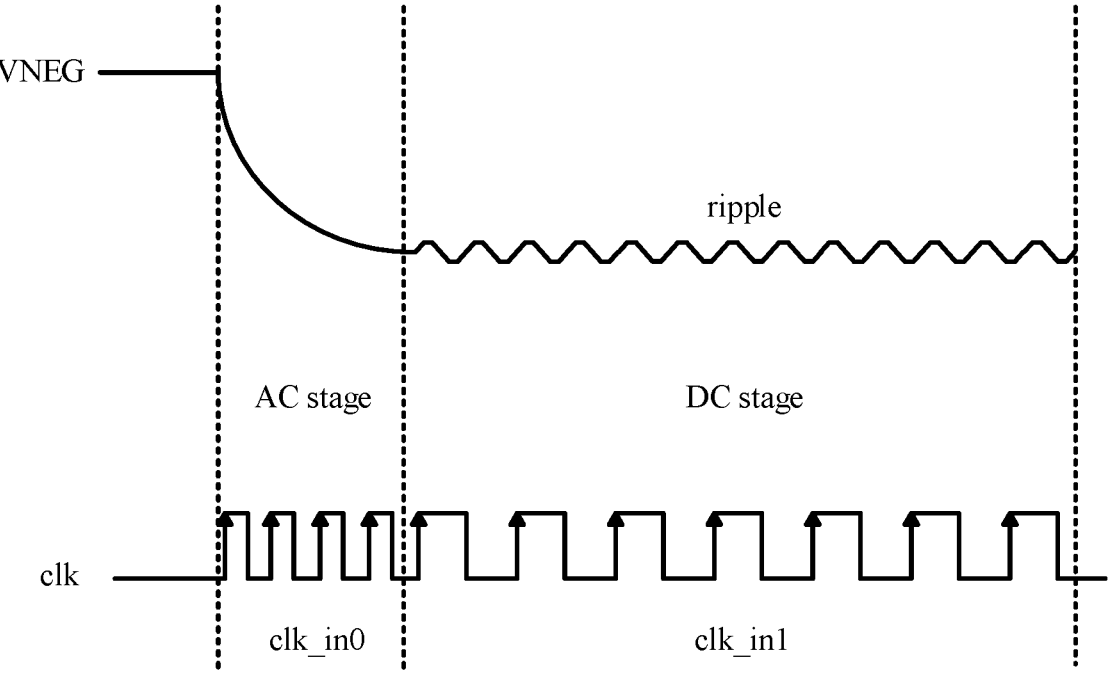
FIG. 2 is a waveform diagram of a clock signal received by a clock signal end of a charge pump and a read voltage output correspondingly by an output end in an example.

Reference is made to FIG. 2, FIG. 2 being a waveform diagram of a clock signal received by a clock signal end of a charge pump and a read voltage output correspondingly by an output end in an example.

In an example, as shown in FIG. 2, during the AC stage, the negative voltage VNEG provided by the negative voltage charge pump for the read voltage of the memory plane gradually decreases. At this time, a clock signal clk provided to the clock signal end of the negative voltage charge pump is an initial clock signal clk_in0. For example, a frequency of the initial clock signal clk_in0 is 50 MHz. During the DC stage, the negative supply provided by the negative voltage charge pump for the read voltage of the memory plane tends to be stabilized. At this time, in order to reduce power consumption after the negative voltage is stabilized, the initial clock signal clk_in0 provided to the clock signal end of the negative voltage charge pump is underclocked. For example, a frequency of an underclocked clock signal clk_in1 is 25 MHz.

As the number of the stack layers increases, a value of the voltage output by the negative voltage charge pump becomes increasingly small, resulting in a larger ripple. In the three-dimensional memory, where both accuracy and stability of the read voltage are required, since a magnitude of the ripple of the voltage of the negative supply provided by the negative voltage charge pump affects the stability of the read voltage, the magnitude of the ripple of the voltage is required to be kept in a small range. The ripple of the charge pump is known to be related to three parameters as in the following formula:

$$V_{ripple} \propto I_{load} \div (f_{clk} \times C_{load})$$

The magnitude of the ripple of charge pump is directly proportional to a load current ($I_{load}$) and inversely proportional to a clock frequency ($f_{clk}$) and a load-side capacitance ($C_{load}$). Therefore, to reduce the ripple of the charge pump, typically the load current may be reduced, the work frequency may be increased, or the load capacitance may be increased. However, in a given design, a total magnitude of the load current is typically unadjustable, while an increase in the frequency causes an increase in power consumption, and an increase in the load capacitance causes an increase in an area and a decrease in the ramp rate.

In the three-dimensional memory, as the number of the stack layers increases, a range of the negative voltage provided for the read voltage is required to be larger, and a magnitude of the negative voltage provided by the negative voltage charge pump is required to be larger, thereby causing an increase in the area that results in an increase in costs. Moreover, in an example, a linear regulator circuit may be connected with the output end of the negative voltage charge pump, so as to provide a stable negative supply through the linear regulator circuit, and the linear regulator circuit also consumes a certain amount of a voltage headroom and a circuit area, thereby increasing the costs.

In order to reduce the circuit area to lower the costs, a solution where the linear regulator circuit is removed may be adopted. After the linear regulator circuit is removed, the voltage provided directly by the negative voltage charge pump has a larger ripple. Furthermore, as the number of the stack layers increases, the magnitude of the voltage output by the negative voltage charge pump becomes increasingly small, resulting in a larger ripple, thereby affecting the stability of the read voltage. As such, the negative supply provided by the negative voltage charge pump cannot satisfy a design requirement. To reduce the circuit area while requiring a reduction in the ripple, the work frequency of the negative voltage charge pump may be increased in the case of removal of the linear regulator circuit. However, the increase in the frequency causes a decrease in current efficiency and an increase in the power consumption.

With continued reference to FIG. 2, in practical simulation, if the linear regulator circuit connected with the output end of the negative voltage charge pump is removed to save the circuit area, at this time, the ripple of the output voltage of the charge pump exceeds the design requirement.

Therefore, reducing the circuit area to lower the costs while ensuring that the ripple of the output voltage of the negative voltage charge pump satisfies the design requirement has become a common concern in the industry.

Examples of the present disclosure provide a memory comprising: a plurality of memory planes and a peripheral circuit coupled to the memory planes. The peripheral circuit comprising:

a plurality of charge pumps, a charge pump having a clock signal end, an input end, and an output end, wherein the output end of each of the charge pumps is coupled to one of the plurality of memory planes; the charge pump is configured to boost an input voltage of the input end according to a clock signal received by the clock signal end and then output the same to the output end; wherein clock signals received by clock signal ends of the plurality of charge pumps are different.

Figures 3, 4:
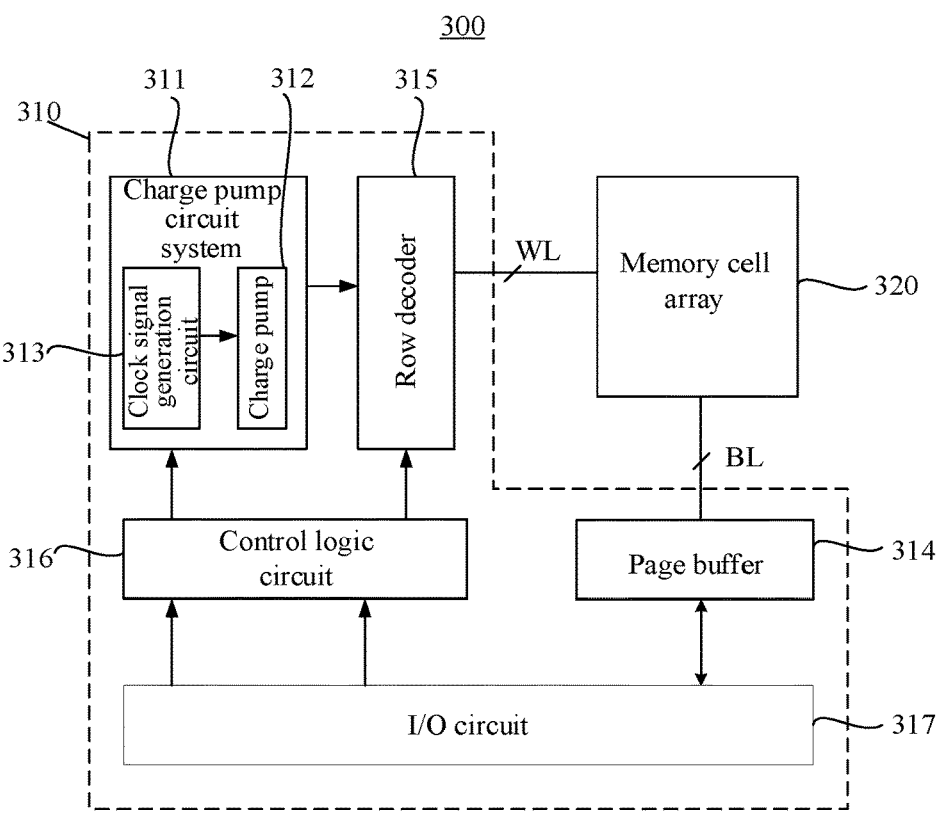
FIG. 3 is an interior block diagram of a memory provided by examples of the present disclosure.
FIG. 4 is a diagram of connection states of charge pumps and memory planes in an async multi-plane independent read operation and in a normal read operation in the examples of the present disclosure.

Reference is made to FIG. 3 and FIG. 4, FIG. 3 being an interior block diagram of the memory provided by the examples of the present disclosure. FIG. 4 is a diagram of connection states of the charge pumps and the memory planes in the async multi-plane independent read operation and in the normal read operation in the examples of the present disclosure.

As shown in FIG. 3, the memory 300 comprises the peripheral circuit 310 and a memory cell array 320 coupled with the peripheral circuit 310, and the memory cell array comprises a plurality of memory chips, each comprising a plurality of memory planes. The peripheral circuit 310 comprises a charge pump circuit 311, and the charge pump circuit 311 comprises a plurality of charge pumps 312 and a clock signal generation circuit 313. The clock signal generation circuit 313 is configured to provide different clock signals for the clock signal ends of the plurality of charge pumps 312. In some examples, as shown in FIG. 4, the memory comprises six memory planes and the peripheral circuit coupled with the six memory planes, wherein the peripheral circuit comprises six charge pumps. The six charge pumps are vneg_pl0, vneg_pl1, vneg_pl2, vneg_pl3, vneg_pl4, and vneg_pl5 respectively, and the six memory planes are load_pl0, load_pl1, load_pl2, load_pl3, load_pl4, and load_pl5 respectively. The charge pump comprises a clock signal end (not shown in FIG. 4), an input end (not shown in FIG. 4), and an output end 402, and the output end 402 of each charge pump is coupled with a memory plane. The clock signal received by the clock signal end of the charge pump may provide a work beat for the charge pump, thereby boosting the input voltage of the input end of the charge pump, and the boosted voltage is output by the charge pump to provide a negative supply for the read voltage of the memory plane. The clock signals received by the clock signal ends of the plurality of charge pumps are different.

In the examples of the present disclosure, the peripheral circuit may further comprise a page buffer 314, a row decoder 315, a control logic circuit 316, and an I/O circuit 317. The peripheral circuit 310 is connected with the memory cell array 320 via a Word Line (WL).

The control logic circuit 316 is configured to receive a command (CMD) and an address (ADDR) and provide a control signal to the row decoder 315 and the charge pump circuit 311 based on the command and the address. Under control of the control logic circuit 316, the charge pump circuit 311 generates word line voltages (e.g., a read voltage, a program voltage, a pass voltage, and a verify voltage, etc.) loaded to the memory cell array.

The page buffer 314 is coupled to a Bit Line (BL) of the memory cell array 320 and configured to read data from the memory cell array 320 under control of the control logic circuit 316. In one example, the page buffer 314 may store data to be programmed into the memory cell array 320. In another example, the page buffer 314 may perform a program verify operation to ensure that the data has been properly programmed into memory cells connected with a selected word lines. The row decoder 315 is connected with a source select line, the word line, and a ground select line of the memory cell array 320. The row decoder 315 may be configured to be controlled by the control logic circuit 316, select or deselect one or more word lines of the memory cell array 320, and drive the word lines using word line voltages generated from the charge pump circuit 311.

The I/O circuit 317 is coupled to the page buffer 314 via a data line. The I/O circuit 317 is configured to receive data from an external circuit of the memory 300 and provide the received data to the memory cell array 320 via the page buffer 314.

In the examples of the present disclosure, the peripheral circuit further comprises: a multiplexer (MUX) coupled between the plurality of charge pumps and the plurality of memory planes. In the async multi-plane independent read operation, each of the charge pumps is coupled to one of the plurality of memory planes through the multiplexer; in the normal read operation, the plurality of charge pumps are connected in parallel through the multiplexer, and output ends of the plurality of charge pumps are coupled to an output node jointly.

With continued reference to FIG. 4, the multiplexer 400 is coupled between the plurality of charge pumps and the plurality of memory planes. The multiplexer 400 is coupled between the plurality of charge pumps and the plurality of memory planes and comprises a plurality of gating switches 401. Each gating switch 401 is coupled between output ends of two adjacent charge pumps. The multiplexer 400 comprises a plurality of input ends and a plurality of output ends, wherein each input end is coupled with one charge pump, and each output end is coupled with one memory plane. Two ends of each gating switch 401 are connected to one input end of the multiplexer 400 and one output end of the multiplexer 400 respectively. For example, one gating switch 401 of the multiplexer 400 is coupled between output ends of vneg_pl0 and vneg_pl1, two input ends of the multiplexer that are connected with the gating switch 401 are coupled with vneg_pl0 and vneg_pl1 respectively, and the two output ends of the multiplexer are coupled with load_pl0 and load_pl1 respectively. During the async multi-plane independent read operation, the plurality of gating switches 401 of the multiplexer 400 are all open, so that each charge pump respectively provides a negative supply for the read voltage of one memory plane corresponding thereto. For example, vneg_pl0 provides a negative supply for the read voltage of load_pl0, and vneg_pl1 provides a negative supply for the read voltage of load_pl1. During the ramping stage (AC stage), the plurality of gating switches 401 of the multiplexer 400 are all closed, and the six negative voltage charge pumps are enabled at the same time. Since the gating switches 401 of the multiplexer 400 are closed, the six negative voltage charge pumps are connected in parallel, and the six negative voltage charge pumps may provide a negative supply for the read voltage of each memory plane respectively. During the stable stage (DC stage), at least part of the plurality of gating switches 401 of the multiplexer 400 are closed, and two charge pumps are enabled to provide a negative supply for a read voltage of at least one memory plane respectively. For example, the closed gating switches 401 comprise at least the gating switch 401 between vneg_pl0 and vneg_pl1, and the two enabled charge pumps may be vneg_pl0 and vneg_pl1, wherein vneg_pl0 and vneg_pl1 provide a negative supply for the read voltage of the memory plane load_pl0 jointly. Locations of the two enabled charge pumps are not limited in the examples of the present disclosure, that is, the two enabled charge pumps may or may not be adjacent. Here, during the async multiplane independent read operation, clock signals received by clock signal ends of the six enabled charge pumps are different. During the normal read operation, clock signals received by clock signal ends of the two enabled charge pumps are different.

It is to be understood that numbers of the charge pumps and the memory planes in the examples of the present disclosure are not limited thereto, and the present application has no particular limitations here.

In the examples of the present disclosure, the clock signals received by the clock signal ends of the plurality of charge pumps are different in that there is preset delay time between the clock signals received by the clock signal ends of the plurality of charge pumps.

Figure 5:
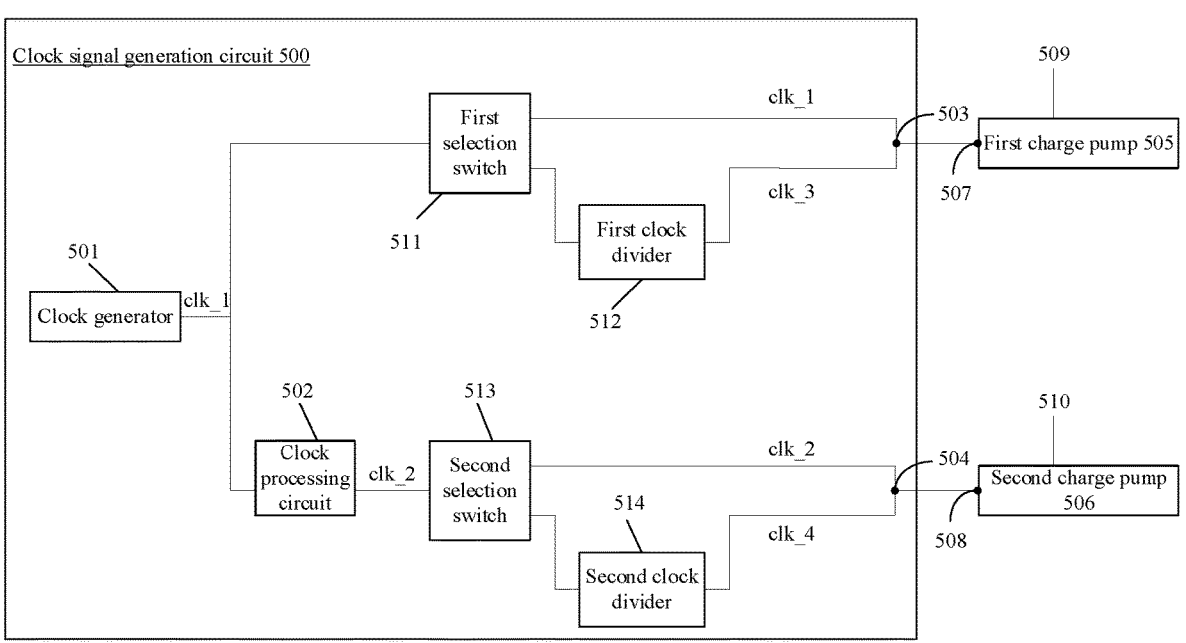
FIG. 5 is a partial interior block diagram of a peripheral circuit provided by the examples of the present disclosure.

Reference is made to FIG. 5, FIG. 5 being a partial interior block diagram of the peripheral circuit provided by the examples of the present disclosure.

In the examples of the present disclosure, the peripheral circuit further comprises: a clock signal generation circuit 500 comprising a clock generator 501 and a clock processing circuit 502, with an input end of the clock processing circuit 502 being coupled to the clock generator 501;

the clock generator 501 is configured to generate a first clock signal;

the clock processing circuit 502 is configured to generate a second clock signal different from the first clock signal based on the first clock signal.

An shown in FIG. 5, the clock signal generation circuit 500 comprises the clock generator 501, and the clock generator 501 is configured to generate the first clock signal clk_1. The clock signal generation circuit 500 further comprises the clock processing circuit 502, with the input end of the clock processing circuit 502 being coupled to an output end of the clock generator 501. The clock processing circuit 502 may receive the first clock signal clk_1 generated by the clock generator 501, and output the second clock signal clk_2 different from the first clock signal clk_1 according to the input first clock signal clk_1.

In the examples of the present disclosure, the first clock signal and the second clock signal have a fixed clock cycle and clock frequency and may have two levels, i.e., a low level and a high level. The high level may vary according to requirements of a circuit. In an example, the clock generator may generate the first clock signal through an oscillator that provides a square wave output.

In the examples of the present disclosure, the clock processing circuit 502 is configured to delay the first clock signal with the preset delay time to generate the second clock signal.

In the examples of the present disclosure, the preset delay time is less than the clock cycle of the first clock signal.

In the examples of the present disclosure, the preset delay time is half of the clock cycle of the first clock signal.

In the examples of the present disclosure, the preset delay time of the second clock signal with respect to the first clock signal is designed to be half of a first clock cycle. There is no difference between work states of the plurality of charge pumps during the ramping stage. However, during the stable stage, since the clock signal is underclocked, delay time between the clock signals received by the clock signal ends of the plurality of charge pumps is also half of the first clock cycle, but work states of the plurality of charge pumps at the same moment varies. That is, moments when the plurality of charge pumps perform charge replenishment of the output ends are different, and the delay time does not vary with changes in a supply voltage and Process, Voltage, Temperature (PVT).

Figure 6:
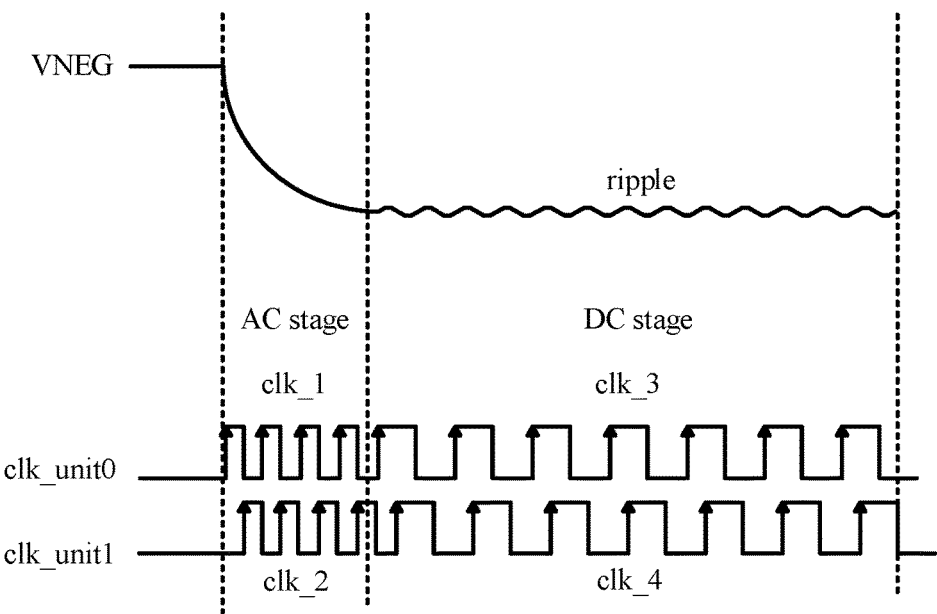
FIG. 6 is a waveform diagram of clock signals received by clock signal ends of a plurality of charge pumps and a read voltage output correspondingly by an output node in the examples of the present disclosure.

Reference is made to FIG. 6, FIG. 6 being a waveform diagram of the clock signals received by the clock signal ends of the plurality of charge pumps and the read voltage output correspondingly by the output node in the examples of the present disclosure.

In the examples of the present disclosure, the plurality of charge pump comprise:

a first charge pump group and a second charge pump group, wherein the first charge pump group comprises at least one first charge pump; the second charge pump group comprises at least one second charge pump; wherein the number of first charge pumps in the first charge pump group is the same as the number of second charge pumps in the second charge pump group;

the clock signal generation circuit comprises a first output end and a second output end;

the clock signal generation circuit is configured to provide a clock signal to a first clock signal end of the first charge pump through the first output end;

the clock signal generation circuit is configured to provide a clock signal to a second clock signal end of the second charge pump through the second output end.

With reference to FIG. 4, the peripheral circuit comprises six charge pumps, and the six charge pumps may be divided into two groups, which are the first charge pump group and the second charge pump group respectively, both comprising the same number of charge pumps. That is, the first charge pump group comprises three first charge pumps. For example, the three first charge pumps are vneg_pl0, vneg_pl2 and vneg_pl4 respectively; and the second charge pump group also comprises three second charge pumps. For example, the three second charge pumps are vneg_pl1, vneg_pl3 and vneg_pl5 respectively. With continued reference to FIG. 5, the clock signal generation circuit 500 further comprises the first output end 503 and the second output end 504, and the first output end 503 and the second output end 504 are respectively coupled to the first clock signal end 507 of the first charge pump 505 in the first charge pump group and the second clock signal end 508 of the second charge pump 506 in the second charge pump group. Since clock signals output by the first output end and the second output end are different, a clock signal clk_unit0 received by the clock signal end of the first charge pump is different from a clock signal clk_unit1 received by the clock signal end of the second charge pump, as shown in FIG. 6.

In the examples of the present disclosure, there are no limitations on positional relationships of the first charge pumps and the second charge pumps. That is, the plurality of first charge pumps in the first charge pump group may or may not be adjacent, and the plurality of second charge pumps in the second charge pump group may or may not be adjacent.

In the examples of the present disclosure, the first charge pump group is configured to, during the ramping stage and according to the first clock signal received by the first clock signal end, boost the input voltage received by a first input end of the first charge pump and then output the same to an output node;

the second charge pump group is configured to, during the ramping stage and according to the second clock signal received by the second clock signal end, boost the input voltage received by a second input end of the second charge pump and then output the same to the output node.

In an example, with reference to FIG. 4 and FIG. 6, during the ramping stage (AC stage), the plurality of gating switches 401 of the multiplexer 400 are all closed, and all the first charge pumps and all the second charge pumps are enabled and provide a negative supply for the read voltage of each memory plane jointly, causing the negative voltage VNEG to decrease rapidly. In conjunction with FIG. 5 and FIG. 6, clk_unit0 and clk_unit1 respectively are the clock signals input to the clock signal ends of the first charge pump and the second charge pump. In a further example, the first output end 503 and the second output end 504 of the clock signal generation circuit 500 output the first clock signal clk_1 and the second clock signal clk_2 respectively. The first clock signal clk_1 is input to the first clock signal end 507 of the first charge pump 505, so as to boost the input voltage received by the first input end 509 of the first charge pump 505 and then output the same to an output node. The second clock signal clk_2 is input to the second clock signal end 508 of the second charge pump 506, so as to boost the input voltage received by the second input end 510 of the second charge pump 506 and then output the same to the output node. Since the plurality of gating switches 401 of the multiplexer 400 are all closed, the closed gating switches 401 causes pathway to be formed throughout the multiplexer 400, and the output node may be any one of the output ends of the multiplexer 400, which provides the same node voltage for all the memory planes. In FIG. 4, the six enabled charge pumps may collectively provide a negative supply for the read voltage of each of the six memory planes.

In the examples of the present disclosure, any one of the first charge pumps in the first charge pump group is configured to, during the stable stage and according to a third clock signal received by the first clock signal end, process the input voltage received by the first input end of the first charge pump and then output the same to the output node;

any one of the second charge pumps in the second charge pump group is configured to, during the stable stage and according to a fourth clock signal received by the second clock signal end, process the input voltage received by the second input end of the second charge pump and then output the same to the output node.

With reference to FIG. 4 and FIG. 6, during the stable stage (DC stage), at least part of the gating switches 401 of the multiplexer 400 are closed. For example, if the negative voltage charge pumps are to provide a negative supply for the read voltage of load_pl0, the gating switch 401 between vneg_pl0 and vneg_pl1 may be closed, while the other gating switches 401 are open. At the same time, one first charge pump vneg_pl0 and one second charge pump vneg_pl1 are enabled. At this time, the enabled first charge pump vneg_pl0 and second charge pump vneg_pl1 jointly provide a negative supply for the read voltage of at least one memory plane comprising load_pl0, so as to keep the negative voltage VNEG stable. Here, the output node is located at an output end of the multiplexer that is coupled with load_pl0. That is, the output node is located at the output end of the multiplexer 400 that is coupled with a target memory plane. In an example, if the negative voltage charge pumps are to provide a negative supply for the read voltage of a plurality of adjacent memory planes comprising load_pl0, a plurality of adjacent gating switches 401 comprising at least the gating switch 401 between vneg_pl0 and vneg_pl1 may be closed. At the same time, one first charge pump vneg_pl0 and one second charge pump vneg_pl1 are enabled. If the negative voltage charge pumps are to provide a negative supply for the read voltage of all the memory planes, all the gating switches 401 may be closed. At the same time, one first charge pump vneg_pl0 and one second charge pump vneg_pl1 are enabled. At this time, the enabled one first charge pump vneg_pl0 and one second charge pump vneg_pl1 provide a negative supply for the read voltage of all the six memory planes jointly. In the examples of the present disclosure, in the normal read operation, the negative voltage charge pumps may also provide a negative supply for the read voltage of any number of memory planes among all the memory planes, which is not limited in the present disclosure.

With reference to FIG. 5 and FIG. 6, the first output end 503 and the second output end 504 of the clock signal generation circuit 500 output the third clock signal clk_3 and the fourth clock signal clk_4 respectively. The third clock signal clk_3 is input to the first clock signal end 507 of the first charge pump 505, so as to boost the input voltage received by the first input end 509 of the first charge pump 505 and then output the same to the output node. The fourth clock signal clk_4 is input to the second clock signal end 508 of the second charge pump 506, so as to boost the input voltage received by the second input end 510 of the second charge pump 506 and then output the same to the output node.

As shown in FIG. 5, in the examples of the present disclosure, the clock signal generation circuit 500 further comprises: a first selection switch 511 and a first clock divider 512; an input end of the first selection switch 511 is coupled to the clock generator 501, an output end of the first selection switch 511 is coupled to the first output end 503 of the clock signal generation circuit 500 or to the first clock divider 512, and an output end of the first clock divider 512 is coupled to the first output end 503 of the clock signal generation circuit 500;

the first selection switch 511 is configured so that during the ramping stage, the output end of the first selection switch 511 is coupled to the first output end 503 of the clock signal generation circuit 500 to transmit the first clock signal clk_1 generated by the clock generator 501 to the first charge pump 505; and during the stable stage, the output end of the first selection switch 511 is coupled to the first clock divider 512 to transmit the first clock signal clk_1 generated by the clock generator 501 to the first clock divider 512;

the first clock divider 512 is configured to, during the stable stage, perform frequency division processing according to the first clock signal clk_1 to generate the third clock signal clk_3 and transmit the third clock signal clk_3 to the first charge pump 505.

As shown in FIG. 5, in the examples of the present disclosure, the clock signal generation circuit 500 further comprises: a second selection switch 513 and a second clock divider 514; an input end of the second selection switch 513 is coupled to the clock processing circuit 502, an output end of the second selection switch 513 is coupled to the second output end 504 of the clock signal generation circuit 500 or to the second clock divider 514, and an output end of the second clock divider 514 is coupled to the second output end 504 of the clock signal generation circuit 500;

the second selection switch 513 is configured so that during the ramping stage, the output end of the second selection switch 513 is coupled to the second output end 504 of the clock signal generation circuit 500 to transmit the second clock signal clk_2 generated by the clock processing circuit 502 to the second charge pump 506; and during the stable stage, the output end of the second selection switch 513 is coupled to the second clock divider 514 to transmit the second clock signal clk_2 generated by the clock processing circuit 502 to the second clock divider 514;

the second clock divider 514 is configured to, during the stable stage, perform frequency division processing according to the second clock signal clk_2 to generate the fourth clock signal clk_4 and transmit the fourth clock signal clk_4 to the second charge pump 506.

In the examples of the present disclosure, during the ramping stage, the clock signal generation circuit provides the first clock signal and the second clock signal for the first clock signal end of the first charge pump and the second clock signal end of the second charge pump respectively, and there is no difference between the work states of the first charge pump and the second charge pump. During the stable stage, compared with the case where only one charge pump is enabled, the examples of the present disclosure enable two charge pumps, thereby halving a current load on each charge pump basic unit. Meanwhile, since the frequency of the clock signal provided to the clock signal end of the charge pump is reduced, the current efficiency is improved.

During the stable stage, compared with the case where only two charge pumps are enabled with the same clock signal being provided to clock signal ends of the two charge pumps, the clock signal generation circuit of the examples of the present disclosure respectively provides the third clock signal and the fourth clock signal for the first clock signal end of the first charge pump and the second clock signal end of the second charge pump, so that moments when the first charge pump and the second charge pump perform charge replenishment of the output ends are staggered, thereby reducing a peak current.

With reference to FIG. 6, in the examples of the present disclosure, the clock cycle of the first clock signal clk_1 and the clock cycle of the second clock signal clk_2 are both a first cycle. In an example, the first cycle corresponds to a frequency of 50 MHz;

a clock cycle of the third clock signal clk_3 and a clock cycle of the fourth clock signal clk_4 are the same, both being a second cycle; the second cycle is twice the first cycle. In an example, the second cycle corresponds to a frequency of 25 MHz.

In the examples of the present disclosure, in order to reduce the power consumption, the clock signal is under-clocked during the stable stage, and a clock delay of the underclocked fourth clock signal clk_4 with respect to the third clock signal clk_3 does not vary with the changes in the supply voltage and PVT.

In the examples of the present disclosure, the clock processing circuit comprise: an inverter circuit.

In the examples of the present disclosure, the clock processing circuit may be an inverter circuit, and the inverter circuit may generate the second clock signal clk_2 that is phase-inverted with respect to the first clock signal clk_1, according to the input first clock signal clk_1. The inverter circuit comprises an inverter.

In one example, an RC clock delay circuit is used to achieve a latency of the clock signal. Examples of the present disclosure use only one inverter (i.e., clock process-ing circuit) to achieve the latency of the clock signal, thereby avoiding defects such as a complicated control logic of the RC clock delay circuit, a large area, and a clock delay varying with the changes in the PVT, etc.

In the examples of the present disclosure, the charge pump boosts the input voltage of the input end and then outputs an output voltage to the output end, wherein an absolute value of the output voltage is greater than an absolute value of the input voltage.

Figures 7, 8:
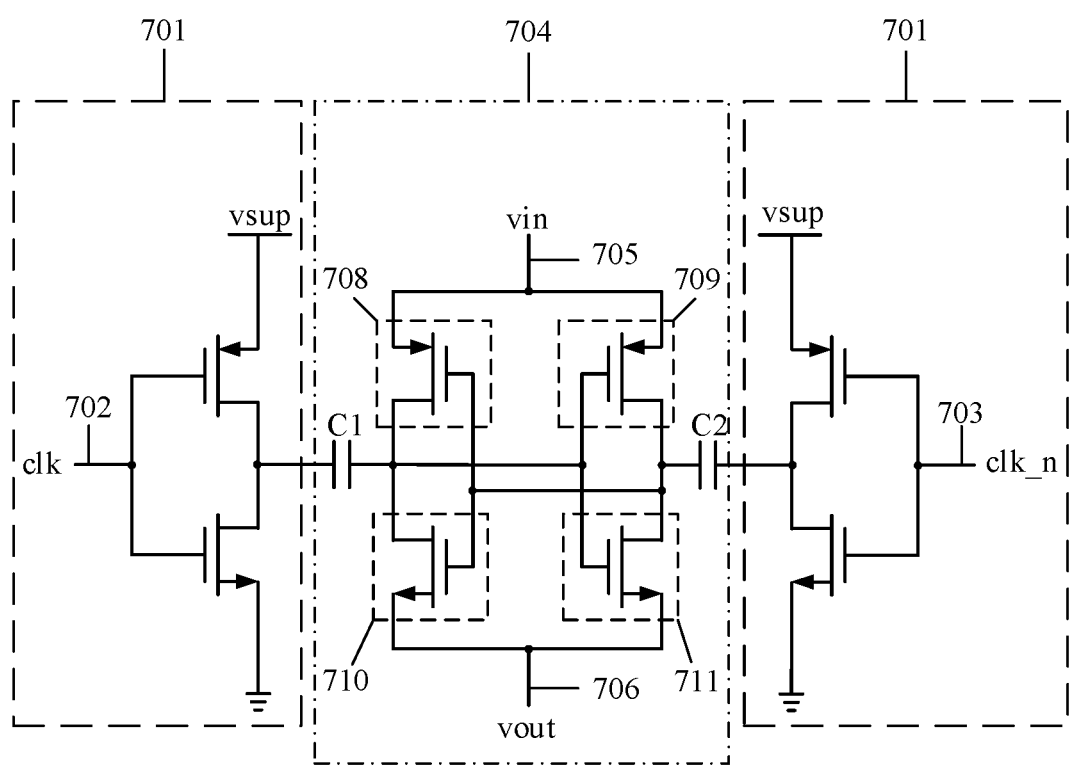
FIG. 7 is a circuit diagram of a charge pump provided by the examples of the present disclosure.
FIG. 8 is a block diagram of a memory system provided by the examples of the present disclosure.

Reference is made to FIG. 7, FIG. 7 being a circuit diagram of the charge pump provided by the examples of the present disclosure.

As shown in FIG. 7, the charge pump provided by the examples of the present disclosure may be a cross-coupled charge pump 704. The cross-coupled charge pump 704 comprises one input end 705, one output end 706, and two clock signal ends 702 and 703. The cross-coupled charge pump 704 may comprise two N-type transistors, which are first NMOS transistor 710 and second NMOS transistor 711 respectively, and two P-type transistors, which are first PMOS transistor 708 and second PMOS transistor 709 respectively. A gate of the first NMOS transistor 710, a gate of the first PMOS transistor 708, a drain of the second NMOS transistor 711, and a drain of the second PMOS transistor 709 are connected; a gate of the second NMOS transistor 711, a gate of the second PMOS transistor 709, a drain of the first NMOS transistor 710, and a drain of the first PMOS transistor 708 are connected. The input end 705 of the charge pump is connected with a source of the first PMOS transistor 708 and a source of the second PMOS transistor 709; the output end 706 of the charge pump is connected with a source of the first NMOS transistor 710 and a source of the second NMOS transistor 711. The cross-coupled charge pump 704 further comprises two capacitors, which are first capacitor C1 and second capacitor C2 respectively, wherein one end of the first capacitor C1 is connected with the gate of the second PMOS transistor 709, and the other end of the first capacitor C1 is connected with one clock signal end 702; one end of the second capacitor C2 is connected with the gate of the first PMOS transistor 708, and the other end of the second capacitor C2 is connected with the other clock signal end 703.

As shown in FIG. 7, the charge pump provided by the examples of the present disclosure may further comprise two buffer circuits 701, so as to improve driving of the charge pump. The two buffer circuits 701 are coupled between any of the capacitors of the charge pump and a corresponding clock signal end respectively. For example, one of the buffer circuits 701 is coupled between the first capacitor C1 and one clock signal end 702, and the other buffer circuit 701 is coupled between the second capacitor C2 and the other clock signal end 703. In an example, the buffer circuit can be an inverter circuit, as shown in FIG. 7, and the inverter circuit may be composed of one NMOS transistor and one PMOS transistor, wherein a gate of the NMOS transistor and a gate of the PMOS transistor are connected together as an input end; a drain of the PMOS transistor and a drain of the NMOS transistor are connected together as an output end, a source of the PMOS transistor is connected with a supply vsup, and a source of the NMOS transistor is grounded.

Based on a work principle of the cross-coupled charge pump, it can be seen that clock signals received by two clock signal ends of one charge pump are inverted with respect to each other, and in every half clock cycle, half of circuits of the charge pump work. That is, when the input end of the charge pump receives an input voltage $V_{in}$, if the clock signal end connected with the second capacitor C2 receives a high level $V_{CLK}$ and the clock signal end connected with the first capacitor C1 receives a low level $V_0$ ($V_0=0$). At a transient when the clock signal end receives a rising edge of the clock signal, the second PMOS transistor 709 and the first NMOS transistor 710 are turned on, and the first PMOS transistor 708 and second NMOS transistor 711 are turned off. The charge pump performs charge replenishment of the output end, causing the voltage of the output end to increase to Vin+$V_{CLK}$. If the clock signal end connected with the first capacitor C1 receives the high level $V_{CLK}$ and the clock signal end connected with the second capacitor C2 receives the low level $V_0$ ($V_0$=0). At the transient when the clock signal end receives the rising edge of the clock signal, the first PMOS transistor 708 and the second NMOS transistor 711 are turned on, and the second PMOS transistor 709 and first NMOS transistor 710 are turned off. The charge pump performs charge replenishment of the output end, causing the voltage of the output end to increase to $V_{in}$+$V_{CLK}$. With switches between high and low levels of the two clock signal ends of the charge pump, the cross-coupled charge pump repeats above charge replenishment states alternately, so that the voltage of the output end of the charge pump is always kept at $V_{in}$+$V_{CLK}$. In the examples of the present disclosure, during the stable stage after clock signal underclocking, due to the presence of the preset delay time of the fourth clock signal with respect to the third clock signal, in each clock cycle, while the first charge pump provides charges to the output end, the clock delay may cause a second charge pump basic unit to perform charge replenishment of an output end at a clock flip (i.e., a rising edge of the fourth clock signal). Compared with the case where clock signal ends of two charge pumps receive the same clock signals and the clock signals are underclocked, the two charge pumps of the examples of the present disclosure provide charges to the output node with halved time delay, and such clock delay mechanism can effectively reduce the ripple of the voltage of the output node.

Taking the six charge pumps in FIG. 4 as an example, it is assumed that a current load on each memory plane is 150 μA. Simulation conditions are set as follows: in a normal read mode, VCC=2.5 V, a temperature is 25° C., a process corner is a Typical Typical Corner (TT corner), and a target value of the negative voltage is −3 V. For ripples of output voltages in three different solutions, power consumption on the VCC supply voltage and stabilized negative voltages are shown in Table I below:

| Solution | Ripple (mV) | Power Consumption (mA) | vneg (V) |
|---|---|---|---|
| 1 | 29.9 | 3.93 | −2.98 |
| 2 | 42.5 | 3.38 | −3 |
| 3 | 29.3 | 3.38 | −3 |

In Table I, data of all the three solutions is measured during the stable stage. Solution 1 is a case where only one charge pump is enabled without underclocking a clock signal provided to a clock signal end of the charge pump. In solution 2, two charge pumps are enabled with clock signals respectively provided to clock signal ends of the two charge pumps being underclocked but the two clock signals respectively provided to clock signal ends of the two charge pumps being the same. That is, there is no clock delay between the two clock signals provided to the two charge pumps. Solution 3 is a solution provided by the example of the present disclosure.

It can be seen from Table I that the output voltage provided by the charge pump in solution 1 cannot reach the target value. In solution 2, enabling the two charge pumps can effectively improve the current efficiency and drive capability, the improvement of the drive capability may achieve faster recovery when the read voltage is subjected to interference, and the improvement of the current efficiency may reduce the power consumption of the negative voltage charge pump effectively. However, the negative voltage ripple provided by the two charge pumps in solution 2 cannot satisfy the requirement. The solution provided by the examples of the present disclosure can effectively reduce the ripple of the voltage output to the output node on the basis of improving the current efficiency and the drive capability effectively.

Under the premise of effective combination and use of an existing circuit, the examples of the present disclosure can achieve a very small ripple of the output voltage of the negative voltage charge pump in the normal read operation by adding only two inverters. It may be understood that the examples of the present disclosure use the inverter to produce a latency between the second clock signal and the first clock signal, providing a negative voltage ripple of a magnitude close to that is provided by the RC clock delay circuit. The use of the RC clock delay circuit adds more circuit area, increases more control logics, and causes a change in the latency due to the PVT.

Reference is made to FIG. 8, FIG. 8 being a block diagram of a memory system provided by the examples of the present disclosure. As shown in FIG. 8, the examples of the present disclosure provide a memory system 801, which comprises:

the memory 802 as described in the above technical solution; and a controller 803 coupled to the memory 802 and configured to control the memory 802.

In the examples of the present disclosure, the memory system 801 may be integrated into various types of memory apparatuses, e.g., be included in the same package, such as a Universal Flash Storage (UFS) package or an Embedded Multi Media Card (eMMC) package. That is, the memory system 801 may be applied to and packaged into different types of electronic products, e.g., a mobile phone (such as a cellphone), a desktop computer, a tablet computer, a notebook computer, a server, a vehicle apparatus, a gaming console, a printer, a pointing apparatus, a wearable apparatus, a smart sensor, a mobile supply, a Virtual Reality (VR) apparatus, an Augmented Reality (AR) apparatus, or any other suitable electronic apparatuses having storages therein.

In some examples, the controller 803 is configured to operate in low duty-cycle environments such as a Secure Digital (SD) card, a Compact Flash (CF) card, a Universal Serial Bus (USB) flash drive, or other media for use in electronic apparatuses, such as a personal computer, a digital camera, and a mobile phone, etc.

In some other examples, the controller 803 is configured to operate in high duty-cycle environments, such as a Solid State Drive (SSD) or an embedded Multi-Media Card (eMMC) which are used as data storages for mobile apparatuses, such as a smartphone, a tablet computer, and a notebook computer, etc., and enterprise memory arrays.

The controller 803 may be configured to control operations of a semiconductor device, e.g. read, erase, and program operations. The controller 803 may be further configured to manage various functions with respect to data stored or to be stored in the semiconductor device, including but not limited to, bad block management, garbage collection, logical-to-physical address conversion, and wear leveling, etc. In some examples, the controller 803 is further configured to process an Error Correction Code (ECC) with respect to data read from or written to the semiconductor device.

The controller 803 may further perform any other suitable functions, e.g., formatting the semiconductor device. The controller 803 may communicate with an external apparatus (e.g., a host) according to a communication protocol. For example, the controller 803 may communicate with the external apparatus through at least one of various interface protocols, such as a USB protocol, an MMC protocol, a Peripheral Component Interconnection (PCI) protocol, a PCI Express (PCI-E) protocol, an Advanced Technology Attachment (ATA) protocol, a Serial ATA protocol, a Parallel ATA protocol, a Small Computer System Interface (SCSI) protocol, an Enhanced Small Drive Interface (ESDI) proto- col, an Integrated Drive Electronics (IDE) protocol, and a Firewire protocol, etc.

Examples of the present disclosure further provide an operation method of a memory. The memory comprises: a plurality of memory planes and a peripheral circuit coupled to the memory planes. The peripheral circuit comprises: a plurality of charge pumps, a charge pump having a clock signal end, an input end, and an output end, wherein the output end of each of the charge pumps is coupled to one of the plurality of memory planes. The operation method comprises:

receiving, by the clock signal ends of the plurality of charge pumps, clock signals; and boosting input voltages of the input ends and then out- putting the same to the output ends, in response to the clock signals received by the clock signal ends, wherein clock signals received by clock signal ends of the plurality of charge pumps are different.

In the examples of the present disclosure, there is preset delay time between the clock signals received by the clock signal ends of the plurality of charge pumps.

In the examples of the present disclosure, the peripheral circuit further comprises: a clock signal generation circuit comprising a clock generator and a clock processing circuit, with an input end of the clock processing circuit being coupled to the clock generator;

the clock generator generates a first clock signal;

the clock processing circuit generates a second clock signal different from the first clock signal based on the first clock signal.

In the examples of the present disclosure, the clock processing circuit generating the second clock signal differ- ent from the first clock signal based on the first clock signal comprises:

the clock processing circuit delaying the first clock signal with the preset delay time to generate the second clock signal.

In the examples of the present disclosure, the preset delay time is less than the clock cycle of the first clock signal.

In the examples of the present disclosure, the preset delay time is half of the clock cycle of the first clock signal.

In the examples of the present disclosure, the peripheral circuit further comprises: a multiplexer coupled between the plurality of charge pumps and the plurality of memory planes;

in an async multi-plane independent read operation, each of the charge pumps outputs a boosted voltage to one of the plurality of memory planes through the multi- plexer; in a normal read operation, the plurality of charge pumps are connected in parallel through the multiplexer, and the plurality of charge pumps output boosted voltages to an output node jointly.

In the examples of the present disclosure, the plurality of charge pump comprise:

a first charge pump group and a second charge pump group, wherein the first charge pump group comprises at least one first charge pump; the second charge pump group comprises at least one second charge pump; wherein the number of first charge pumps in the first charge pump group is the same as the number of second charge pumps in the second charge pump group;

the boosting the input voltages of the input ends and then outputting the same to the output ends, in response to the clock signals received by the clock signal ends, comprises:

during a ramping stage and in response to the first clock signal, the first charge pump group boosting an input voltage received by a first input end of the first charge pump and then outputting the same to an output node; and during the ramping stage and in response to the second clock signal, the second charge pump group boosting the input voltage received by a second input end of the second charge pump and then outputting the same to the output node.

In the examples of the present disclosure, the plurality of charge pumps boosting the input voltages of the input ends and then outputting the same to the output ends, in response to the clock signals received by the clock signal ends, further comprises:

during a stable stage and in response to a third clock signal received by the first clock signal end, any one of first charge pumps in the first charge pump group processing the input voltage received by the first input end and then outputting the same to the output node; and during the stable stage and in response to a fourth clock signal received by the second clock signal end, any one of second charge pumps in the second charge pump group processing the input voltage received by the second input end and then outputting the same to the output node.

In the examples of the present disclosure, the operation method of the memory further comprises: during the stable stage, performing frequency division processing on the first clock signal to generate the third clock signal; and perform- ing frequency division processing on the second clock signal to generate the fourth clock signal.

In the examples of the present disclosure, the clock cycle of the first clock signal and the clock cycle of the second clock signal are both a first cycle;

a clock cycle of the third clock signal and a clock cycle of the fourth clock signal are the same, both being a second cycle; the second cycle is twice the first cycle.

In the examples of the present disclosure, the boosting the input voltages of the input ends and then outputting the same to the output ends comprises: the charge pump boosting the input voltage so that an absolute value of a boosted voltage is greater than an absolute value of the input voltage.

The examples of the present disclosure provide a memory, a storage system, and an operation method of a memory. The memory comprises: a plurality of memory planes and a peripheral circuit coupled to the memory planes. The periph- eral circuit comprising: a plurality of charge pumps, a charge pump having a clock signal end, an input end, and an output end, wherein the output end of each of the charge pumps is coupled to one of the plurality of memory planes; the charge pump is configured to boost an input voltage of the input end according to a clock signal received by the clock signal end and then output the same to the output end; wherein clock signals received by clock signal ends of the plurality of charge pumps are different. Compared with the case where the clock signals received by the clock signal ends of the plurality of charge pumps are the same, in the examples of the present disclosure, during the stable stage, the different clock signals received by the clock signal ends of the plurality of charge pumps result in different moments when the plurality of charge pumps provide charges to the output ends, thereby reducing the voltage ripple effectively and improving the stability of the read voltage.

In the light of above, examples of the present disclosure provide a memory, a storage system, and an operation method of a memory.

To achieve the above purpose, the technical solution of the present disclosure is achieved as follows:

In a first aspect, the examples of the present disclosure provide a memory, which comprises: a plurality of memory planes and a peripheral circuit coupled to the memory planes, the peripheral circuit comprising:

a plurality of charge pumps, a charge pump having a clock signal end, an input end, and an output end, wherein the output end of each of the charge pumps is coupled to one of the plurality of memory planes; the charge pump is configured to boost an input voltage of the input end according to a clock signal received by the clock signal end and then output the same to the output end; wherein clock signals received by clock signal ends of the plurality of charge pumps are different.

In some examples, there is preset delay time between the clock signals received by the clock signal ends of the plurality of charge pumps.

In some examples, the peripheral circuit further comprises: a clock signal generation circuit comprising a clock generator and a clock processing circuit, with an input end of the clock processing circuit being coupled to the clock generator;

the clock generator is configured to generate a first clock signal;

the clock processing circuit is configured to generate a second clock signal different from the first clock signal based on the first clock signal.

In some examples, the clock processing circuit is configured to delay the first clock signal with the preset delay time to generate the second clock signal.

In some examples, the preset delay time is less than a clock cycle of the first clock signal.

In some examples, the preset delay time is half of a clock cycle of the first clock signal.

In some examples, the peripheral circuit further comprises: a multiplexer coupled between the plurality of charge pumps and the plurality of memory planes; in an async multi-plane independent read operation, each of the charge pumps is coupled to one of the plurality of memory planes through the multiplexer; in a normal read operation, the plurality of charge pumps are connected in parallel through the multiplexer, and output ends of the plurality of charge pumps are coupled to an output node jointly.

In some examples, the plurality of charge pump comprise: a first charge pump group and a second charge pump group, wherein the first charge pump group comprises at least one first charge pump; the second charge pump group comprises at least one second charge pump; the number of first charge pumps in the first charge pump group is the same as the number of second charge pumps in the second charge pump group;

the clock signal generation circuit comprises a first output end and a second output end;

the clock signal generation circuit is configured to provide a clock signal to a first clock signal end of the first charge pump through the first output end;

the clock signal generation circuit is configured to provide a clock signal to a second clock signal end of the second charge pump through the second output end.

In some examples, the first charge pump group is configured to, during a ramping stage and according to the first clock signal received by the first clock signal end, boost the input voltage received by a first input end of the first charge pump and then output the same to an output node;

the second charge pump group is configured to, during the ramping stage and according to the second clock signal received by the second clock signal end, boost the input voltage received by a second input end of the second charge pump and then output the same to the output node.

In some examples, any one of first charge pumps in the first charge pump group is configured to, during a stable stage and according to a third clock signal received by the first clock signal end, process the input voltage received by the first input end of the first charge pump and then output the same to the output node;

any one of second charge pumps in the second charge pump group is configured to, during the stable stage and according to a fourth clock signal received by the second clock signal end, process the input voltage received by the second input end of the second charge pump and then output the same to the output node.

In some examples, the clock signal generation circuit further comprises: a first selection switch and a first clock divider; an input end of the first selection switch is coupled to the clock generator, an output end of the first selection switch is coupled to a first output end of the clock signal generation circuit or to the first clock divider, and an output end of the first clock divider is coupled to the first output end of the clock signal generation circuit;

the first selection switch is configured so that during a ramping stage, the output end of the first selection switch is coupled to the first output end of the clock signal generation circuit to transmit the first clock signal generated by the clock generator to the first charge pump; and during the stable stage, the output end of the first selection switch is coupled to the first clock divider to transmit the first clock signal generated by the clock generator to the first clock divider;

the first clock divider is configured to, during the stable stage, perform frequency division processing according to the first clock signal to generate the third clock signal and transmit the third clock signal to the first charge pump.

In some examples, the clock signal generation circuit further comprises: a second selection switch and a second clock divider; an input end of the second selection switch is coupled to the clock processing circuit, an output end of the second selection switch is coupled to a second output end of the clock signal generation circuit or to the second clock divider, and an output end of the second clock divider is coupled to the second output end of the clock signal generation circuit;

the second selection switch is configured so that during a ramping stage, the output end of the second selection switch is coupled to the second output end of the clock signal generation circuit to transmit the second clock signal generated by the clock processing circuit to the second charge pump; and during the stable stage, the output end of the second selection switch is coupled to the second clock divider to transmit the second clock signal generated by the clock processing circuit to the second clock divider;

the second clock divider is configured to, during the stable stage, perform frequency division processing according to the second clock signal to generate the fourth clock signal and transmit the fourth clock signal to the second charge pump.

In some examples, a clock cycle of the first clock signal and a clock cycle of the second clock signal are both a first cycle;

a clock cycle of the third clock signal and a clock cycle of the fourth clock signal are the same, both being a second cycle; the second cycle is twice the first cycle.

In some examples, the clock processing circuit comprises: an inverter circuit.

In some examples, the charge pump boosts the input voltage of the input end and then outputs an output voltage to the output end; wherein an absolute value of the output voltage is greater than an absolute value of the input voltage.

In a second aspect, the examples of the present disclosure provide a memory system, which comprises:

the memory as described in the above technical solution; and a controller coupled to the memory and configured to control the memory.

In a third aspect, the examples of the present disclosure provide an operation method of a memory, wherein the memory comprises a plurality of memory planes and a peripheral circuit coupled to the memory planes, and the peripheral circuit comprises: a plurality of charge pumps, a charge pump having a clock signal end, an input end, and an output end; the output end of each of the charge pumps is coupled to one of the plurality of memory planes; the operation method comprises:

receiving, by the clock signal ends of the plurality of charge pumps, clock signals; and boosting input voltages of the input ends and then outputting the same to the output ends, in response to the clock signals received by the clock signal ends, wherein clock signals received by clock signal ends of the plurality of charge pumps are different.

In some examples, there is preset delay time between the clock signals received by the clock signal ends of the plurality of charge pumps.

In some examples, the peripheral circuit further comprises: a clock signal generation circuit comprising a clock generator and a clock processing circuit, with an input end of the clock processing circuit being coupled to the clock generator;

the clock generator generates a first clock signal;

the clock processing circuit generates a second clock signal different from the first clock signal based on the first clock signal.

In some examples, the clock processing circuit generating the second clock signal different from the first clock signal based on the first clock signal comprises:

the clock processing circuit delays the first clock signal with the preset delay time to generate the second clock signal.

In some examples, the preset delay time is less than a clock cycle of the first clock signal.

In some examples, the preset delay time is half of a clock cycle of the first clock signal.

In some examples, the peripheral circuit further comprises: a multiplexer coupled between the plurality of charge pumps and the plurality of memory planes;

in an async multi-plane independent read operation, each of the charge pumps outputs a boosted voltage to one of the plurality of memory planes through the multiplexer; in a normal read operation, the plurality of charge pumps are connected in parallel through the multiplexer, and the plurality of charge pumps output boosted voltages to an output node jointly.

In some examples, the plurality of charge pump comprise:

a first charge pump group and a second charge pump group, wherein the first charge pump group comprises at least one first charge pump; the second charge pump group comprises at least one second charge pump; wherein the number of first charge pumps in the first charge pump group is the same as the number of second charge pumps in the second charge pump group;

the boosting the input voltages of the input ends and then outputting the same to the output ends, in response to the clock signals received by the clock signal ends, comprises:

during a ramping stage and in response to the first clock signal, the first charge pump group boosting an input voltage received by a first input end of the first charge pump and then output the same to an output node; and during the ramping stage and in response to the second clock signal, the second charge pump group boosting the input voltage received by a second input end of the second charge pump and then outputting the same to the output node.

In some examples, the plurality of charge pumps boosting the input voltages of the input ends and then outputting the same to the output ends, in response to the clock signals received by the clock signal ends, further comprises:

during a stable stage and in response to a third clock signal received by the first clock signal end, any one of first charge pumps in the first charge pump group processing the input voltage received by the first input end and then outputting the same to the output node; and during the stable stage and in response to a fourth clock signal received by the second clock signal end, any one of second charge pumps in the second charge pump group processing the input voltage received by the second input end and then outputting the same to the output node.

In some examples, the method further comprises: during the stable stage, performing frequency division processing on the first clock signal to generate the third clock signal; and performing frequency division processing on the second clock signal to generate the fourth clock signal.

In some examples, a clock cycle of the first clock signal and a clock cycle of the second clock signal are both a first cycle;

a clock cycle of the third clock signal and a clock cycle of the fourth clock signal are the same, both being a second cycle; the second cycle is twice the first cycle.

In some examples, the boosting the input voltages of the input ends and then outputting the same to the output ends comprises: the charge pump boosting the input voltage so that an absolute value of a boosted voltage is greater than an absolute value of the input voltage.

The examples of the present disclosure provide a memory, a storage system, and an operation method of a memory. The memory includes: a plurality of memory planes and a peripheral circuit coupled to the memory planes. The peripheral circuit includes: a plurality of charge pumps, a charge pump having a clock signal end, an input end, and an output end, wherein the output end of each of the charge pumps is coupled to one of the plurality of memory planes; the charge pump is configured to boost an input voltage of the input end according to a clock signal received by the clock signal end and then output the same to the output end; wherein clock signals received by clock signal ends of the plurality of charge pumps are different. Compared with the case where the clock signals received by the clock signal ends of the plurality of charge pumps are the same, in the examples of the present disclosure, clock signals received by the clock signal ends of the plurality of charge pumps are different, resulting in different moments when the plurality of charge pumps provide charges to the output ends, thereby reducing the voltage ripple effectively and improving the stability of the read voltage.

It is to be understood that, references to "one example" or "an example" throughout this specification mean that example features, structures, or characteristics related to the example are included in at least one example of the present disclosure. Therefore, "in one example" or "in an example" presented everywhere throughout this specification does not necessarily refer to the same example. Furthermore, these example features, structures, or characteristics may be incorporated in one or more examples in any suitable manner. It is to be understood that, in various examples of the present disclosure, sequence numbers of the above processes do not indicate an execution sequence, and an execution sequence of various processes shall be determined by functionalities and intrinsic logics thereof, and shall constitute no limitation on an implementation process of the examples of the present disclosure. The above sequence numbers of the examples of the present disclosure are only for description, and do not represent goodness and badness of the examples.

The above descriptions are merely example implementations of the present disclosure, and not intended to limit the patent scope of the present disclosure. Equivalent structure transformation made within using the contents of the specification and the drawings of the present disclosure under the concept of the present disclosure, or direct/indirect application to other related technical fields are both encompassed within the patent protection scope of the present disclosure.

What is claimed is:
1. A memory, comprising:
a plurality of memory planes; and
a peripheral circuit coupled to the plurality of memory planes, comprising:
  a plurality of charge pumps, wherein each of the plurality of charge pumps has a clock signal end, an input end, and an output end, the output end of each of the plurality of charge pumps coupled to a memory plane of the plurality of memory planes, and each of the plurality of charge pumps is configured to boost an input voltage of the input end according to a first clock signal and a second clock signal received by the clock signal end and output the same to the output end, and wherein the first and second clock signals received by the clock signal ends of the plurality of charge pumps are different and there is a preset delay time between the first and second clock signals received by the clock signal ends;
  a clock generator configured to generate the first clock signal; and a clock processing circuit configured to delay the first clock signal with the preset delay time to generate the second clock signal different from the first clock signal based on the first clock signal.
2. The memory of claim 1, wherein the clock processing circuit includes an input end coupled to the clock generator.
3. The memory of claim 1, wherein the preset delay time is less than a clock cycle of the first clock signal.
4. The memory of claim 1, wherein the preset delay time is half of a clock cycle of the first clock signal.
5. The memory of claim 1, wherein the peripheral circuit further comprises a multiplexer coupled between the plurality of charge pumps and the plurality of memory planes,
  wherein, in an async multi-plane independent read operation, each of the plurality of charge pumps is coupled to the memory plane of the plurality of memory planes through the multiplexer; and
  in a normal read operation, the plurality of charge pumps are connected in parallel through the multiplexer, and output ends of the plurality of charge pumps are coupled to an output node jointly.
6. The memory of claim 2, wherein the plurality of charge pumps comprise:
  a first charge pump group comprising at least one first charge pump;
  a second charge pump group comprising at least one second charge pump,
  wherein a number of first charge pumps in the first charge pump group is the same as a number of second charge pumps in the second charge pump group;
  a clock signal generation circuit, including the clock generator and the clock processing circuit, comprises a first output end and a second output end;
  the clock signal generation circuit is configured to provide a clock signal to a first clock signal end of the first charge pump through the first output end; and
  the clock signal generation circuit is configured to provide the clock signal to a second clock signal end of the second charge pump through the second output end.
7. The memory of claim 6, wherein the first charge pump group is configured to, during a ramping stage, boost the input voltage received by a first input end of the first charge pump and output the same to an output node based on the first clock signal received by the first clock signal end; and
  the second charge pump group is configured to, during the ramping stage, boost the input voltage received by a second input end of the second charge pump and output the same to the output node based on the second clock signal received by the second clock signal end.
8. The memory of claim 7, wherein any of the first charge pumps in the first charge pump group is configured to, during a stable stage and according to a third clock signal received by the first clock signal end, process the input voltage received by the first input end of the first charge pump and output the same to the output node; and
  any of the second charge pumps in the second charge pump group is configured to, during the stable stage and according to a fourth clock signal received by the second clock signal end, process the input voltage received by the second input end of the second charge pump and then output the same to the output node.
9. The memory of claim 8, wherein the clock signal generation circuit further comprises:
  a first selection switch; and
  a first clock divider,
  wherein an input end of the first selection switch is coupled to the clock generator, an output end of the first selection switch is coupled to the first output end of the clock signal generation circuit or to the first clock divider, and an output end of the first clock divider is coupled to the first output end of the clock signal generation circuit;

the first selection switch is configured so that, during the ramping stage, the output end of the first selection switch is coupled to the first output end of the clock signal generation circuit to transmit the first clock signal generated by the clock generator to the first charge pump, and, during the stable stage, the output end of the first selection switch is coupled to the first clock divider to transmit the first clock signal generated by the clock generator to the first clock divider; and the first clock divider is configured to, during the stable stage, perform frequency division processing according to the first clock signal to generate the third clock signal and transmit the third clock signal to the first charge pump.

10. The memory of claim 8, wherein the clock signal generation circuit further comprises:

a second selection switch;

a second clock divider, wherein an input end of the second selection switch is coupled to the clock processing circuit, an output end of the second selection switch is coupled to the second output end of the clock signal generation circuit or to the second clock divider, and an output end of the second clock divider is coupled to the second output end of the clock signal generation circuit;

the second selection switch is configured so that, during the ramping stage, the output end of the second selection switch is coupled to the second output end of the clock signal generation circuit to transmit the second clock signal generated by the clock processing circuit to the second charge pump, and, during the stable stage, the output end of the second selection switch is coupled to the second clock divider to transmit the second clock signal generated by the clock processing circuit to the second clock divider; and the second clock divider is configured to, during the stable stage, perform frequency division processing according to the second clock signal to generate the fourth clock signal and transmit the fourth clock signal to the second charge pump.

11. The memory of claim 8, wherein a clock cycle of the first clock signal and a clock cycle of the second clock signal are both a first cycle, a clock cycle of the third clock signal and a clock cycle of the fourth clock signal are the same and are a second cycle, and wherein the second cycle is twice the first cycle.

12. The memory of claim 2, wherein the clock processing circuit further comprises an inverter circuit.

13. The memory of claim 1, wherein a charge pump of the plurality of charge pumps boosts the input voltage of the input end and then outputs an output voltage to the output end, and wherein an absolute value of the output voltage is greater than an absolute value of the input voltage.

14. A memory system, comprising:

a memory, comprising:

a plurality of memory planes; and a peripheral circuit coupled to the plurality of memory planes and comprising:

a plurality of charge pumps, wherein each of the plurality of charge pumps has a clock signal end, an input end, and an output end, the output end of each of the plurality of charge pumps is coupled to a memory plane of the plurality of memory planes, and each of the plurality of charge pumps is configured to boost an input voltage of the input end according to a clock signal received by the clock signal end and output the same to the output end, and wherein the clock signals received by clock signal ends of the plurality of charge pumps are different; and a multiplexer coupled between the plurality of charge pumps and the plurality of memory planes, wherein, in an async multi-plane independent read operation, each of the plurality of charge pumps is coupled to the memory plane through the multiplexer, and, in a normal read operation, the plurality of charge pumps are connected in parallel through the multiplexer, and output ends of the plurality of charge pumps are coupled to an output node jointly; and a controller coupled to the memory and configured to control the memory.

15. An operation method of a memory, wherein the memory comprises a plurality of memory planes and a peripheral circuit coupled to the memory planes; the peripheral circuit comprises a plurality of charge pumps, a clock generator configured to generate a first clock signal, and a clock processing circuit configured to generate a second clock signal different from the first clock signal based on the first clock signal; a charge pump has a clock signal end, an input end, and an output end; and the output end of each of the charge pumps is coupled to one of the plurality of memory planes, and the operation method comprises:

receiving, by clock signal ends of the plurality of charge pumps, the first and second clock signals;

boosting input voltages of the input ends and then outputting the same to the output ends, in response to the first and second clock signals received by the clock signal ends; and delaying, by the clock processing circuit, the first clock signal with a preset delay time to generate the second clock signal, the preset delay time being a time between the first and second clock signals received by the clock signal ends.

16. The operation method of claim 15, wherein the clock processing circuit includes an input end coupled to the clock generator.

17. The memory system of claim 14, wherein the peripheral circuit further comprises a clock signal generation circuit comprising:

a clock generator configured to generate a first clock signal; and a clock processing circuit including an input end coupled to the clock generator and configured to delay the first clock signal with a preset delay time to generate a second clock signal different from the first clock signal based on the first clock signal, wherein the preset delay time is a time between the first and second clock signals received by the clock signal ends.

18. The memory system of claim 17, wherein the preset delay time is less than a clock cycle of the first clock signal.

19. The memory of claim 17, wherein the preset delay time is half of a clock cycle of the first clock signal.

20. The memory system of claim 17, wherein the plurality of charge pumps comprise:

a first charge pump group comprising at least one first charge pump;

a second charge pump group comprising at least one second charge pump, wherein a number of first charge pumps in the first charge pump group is the same as a number of second charge pumps in the second charge pump group;

the clock signal generation circuit comprises a first output end and a second output end;

the clock signal generation circuit is configured to provide a clock signal to a first clock signal end of the first charge pump through the first output end; and the clock signal generation circuit is configured to provide the clock signal to a second clock signal end of the second charge pump through the second output end.

* * * * *